(12) United States Patent  
Ford

(10) Patent No.: US 7,835,715 B2  
(45) Date of Patent: Nov. 16, 2010

(54) LOG-ANTILOG MIXER CIRCUIT AND METHOD FOR PRODUCING FREQUENCY CONVERSION

(75) Inventor: James Arthur Ford, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 610 days.

(21) Appl. No.: 11/975,209

(22) Filed: Oct. 17, 2007

(65) Prior Publication Data

US 2009/0104887 A1 Apr. 23, 2009

(51) Int. Cl.
*H04B 1/16* (2006.01)
(52) U.S. Cl. .................................. 455/323; 455/324
(58) Field of Classification Search .............. 455/115.1, 455/130, 313, 314, 317, 318, 323, 324, 330, 455/333, 334; 375/295, 296, 343, 344
See application file for complete search history.

(56) References Cited

U.S. PATENT DOCUMENTS

2005/0197092 A1* 9/2005 Darabi ....................... 455/323
2005/0239420 A1* 10/2005 Nam ........................ 455/115.1
2009/0122907 A1* 5/2009 Ford .......................... 375/295

* cited by examiner

*Primary Examiner*—Thanh C Le
(74) *Attorney, Agent, or Firm*—Farjami & Farjami LLP

(57) ABSTRACT

According to one exemplary embodiment, a method for producing frequency conversion of a communication signal comprises performing a logarithmic transformation of the communication signal to form a logarithmically transformed communication signal, adding the logarithmically transformed communication signal to a logarithmic local oscillator signal, to form a sum signal, and performing an antilogarithmic transformation of the sum signal. In one embodiment, the method may be used to down-convert a reception signal to baseband. In one embodiment, a log-antilog mixer circuit for producing frequency conversion of a communication signal comprises a signal log block configured to receive the communication signal as an input and to provide a logarithmically transformed communication signal as an output, and an antilog block configured to receive a sum signal of the logarithmically transformed communication signal and a logarithmic local oscillator signal.

20 Claims, 7 Drawing Sheets

LOG-ANTILOG MIXER CIRCUIT AND METHOD FOR PRODUCING FREQUENCY CONVERSION

BACKGROUND OF THE INVENTION

1. Field of the Invention

The present invention is generally in the field of electronic circuits and systems. More specifically, the present invention is in the field of electronic communications circuits and systems.

2. Background Art

Mixer circuits are widely used in communications systems to provide frequency conversion of a communication signal during signal processing in a receiver or transmitter. A mixer circuit may be utilized in a receiving system to down-convert a communication signal received at an antenna, from radio frequency (RF) to baseband, for example. When implemented in a receiver, a mixer typically works in conjunction with a low noise amplifier (LNA) which is used to boost an otherwise weak reception signal prior to down-conversion by the mixer. In many modern implementations, receivers, as well as transmitters, are employed in challenging environments, such as to support communication in a multi-mode wireless transceiver, for example. As a result, those systems may be exposed to significant levels of interference, and be expected to tolerate that interference without substantial deterioration in performance.

In the case of a receiver, interference can arise from several sources, including transmitters utilized in nearby wireless communication devices or base stations. Those transmitters may produce signals on the same frequency channel used by the receiver, or an adjacent frequency channel, and in many instances the interference signals may be substantially stronger than a desired reception signal. When large interference signals are present, an LNA providing a signal input to a mixer is likely to be forced to operate outside of its linear range. As is known in the art, non-linear operation of a receiver LNA can result in reception of "blocker signals" that degrade and interfere with a desired reception signal during signal processing. That phenomenon may be further exacerbated by the non-linear performance of the mixer itself.

A conventional approach to improving linearity and blocker resistance of a receiving system is to increase the linear range of the LNA receiving the antenna input. Because, as is known, blocker signals are not seen when an LNA is operating in its linear range, this approach may be effective in reducing LNA produced distortion of a reception signal. This approach fails to address interferences introduced by non-linearity of the mixer, however. Further, the blocker resistance is only effective during linear operation of the LNA, which comes at the cost of increased power consumption by the receiver. Moreover, interference may be seen across a wide dynamic range, and in the presence of powerful interference signals even an LNA with an extended linear range is susceptible to being driven out of linearity. In addition, the increased power consumption required to extend LNA linearity introduces disadvantages of its own, particularly for receivers implemented in mobile devices relying on a finite battery source for power.

Thus, there is a need in the art for a mixer circuit capable of providing frequency conversion of a communication signal, while displaying greater linearity than conventional mixer implementations, and improved blocker resistance over a wide dynamic range.

SUMMARY OF THE INVENTION

A log-antilog mixer circuit and method for producing frequency conversion, substantially as shown in and/or described in connection with at least one of the figures, and as set forth more completely in the claims.

DETAILED DESCRIPTION OF THE INVENTION

The present invention is directed to a log-antilog mixer circuit and method for producing frequency conversion. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
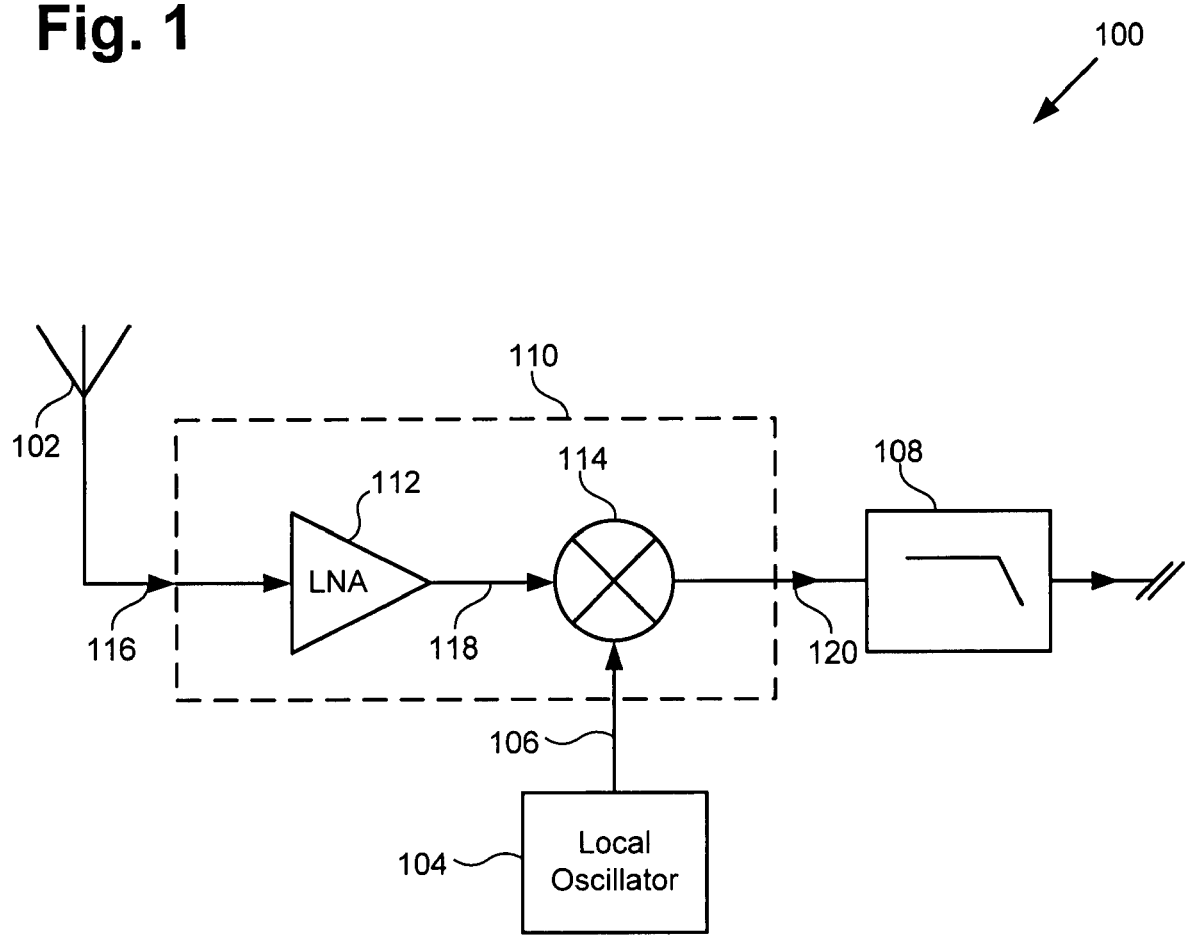
FIG. 1 is a block diagram of a conventional system for producing frequency conversion of a communication signal in a receiver.

FIG. 1 is a block diagram of a conventional system for producing frequency conversion of a communication signal in a receiver. FIG. 1 shows receiving system 100 comprising antenna 102, local oscillator 104 providing local oscillator signal 106, lowpass filter 108, and mixer circuit 110. Also shown in FIG. 1 are mixer circuit components including low noise amplifier (LNA) 112 and mixer 114. In addition, FIG. 1 includes communication signal 116, being provided as an input to mixer circuit 110, LNA output signal 118, and mixer circuit output signal 120. The broken lines at the output of lowpass filter 108 indicate the presence of other receiver components (not shown in FIG. 1), which may contribute to the processing of communication signal 116. Receiving system 100 may be utilized in a receiver supporting cellular telephone communication, or a mobile or stationary receiver operating at radio frequency (RF), for example.

In a conventional approach to implementing a receiving system, such as receiving system 100 in FIG. 1, mixer circuit 110 is typically utilized to down-convert communication signal 116, from a reception frequency such as RF, to an intermediate frequency or baseband, and to provide the down-converted communication signal as mixer circuit output signal 120. A filter, such as lowpass filter 108 may then be used to pass the desired down-converted signal, while blocking undesired signals produced in the mixing process, as is known in the art. In FIG. 1, lowpass filter 108 is shown, corresponding to frequency conversion of communication signal 116 from a reception frequency to baseband.

Frequency conversion of communication signal 116 is facilitated by amplification of the received communication signal by LNA 112. The amplified communication signal is provided as LNA output signal 118, which is then mixed in mixer 114 with local oscillator signal 106 provided by local oscillator 104. In an ideal mixer circuit, the amplification provided by LNA 112 would display a linear response to the strength of communication signal 116. Real, non-ideal LNA 112, however, behaves linearly only over a limited range of received signal strengths.

Figure 2A:
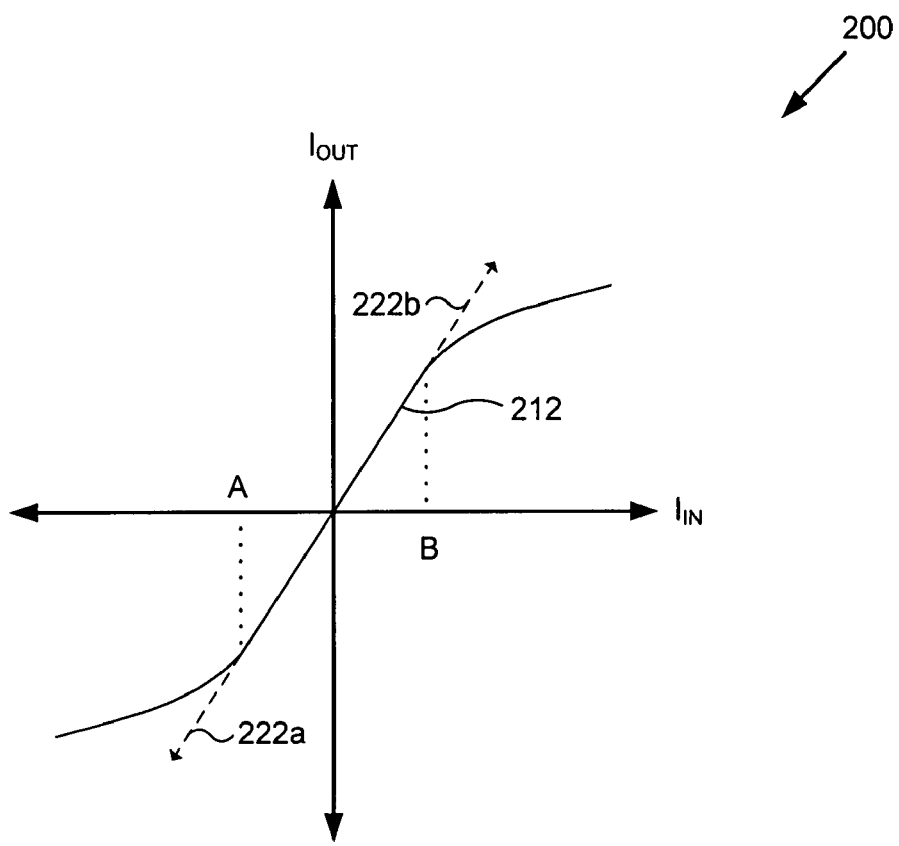
FIG. 2A is a graph showing a typical performance profile for a low noise amplifier used in the conventional system of FIG. 1.

FIG. 2A is a graph showing a typical performance profile for an LNA, such as LNA 112, in FIG. 1. Graph 200, in FIG. 2A, shows an exemplary output signal strength ($I_{OUT}$) as a function of the strength ($I_{IN}$) of a received communication signal. $I_{IN}$, shown on the x-axis of graph 200, corresponds to the strength of communication signal 116, in FIG. 1, while $I_{OUT}$, shown on the y-axis of graph 200, corresponds to the strength of LNA output signal 118, in FIG. 1. The performance of LNA 112 over a range of input signal strengths is shown by LNA response curve 212. It is noted that graph 200 is qualitative only, in recognition of the fact that there may be considerable variability in the actual range of signal strengths across which an LNA may operate in a linear fashion. In FIG. 2A, the linear range of LNA response curve 212 is indicated by the dotted vertical lines intersecting the x-axis at points A and B.

As shown in FIG. 2A, for input signal strengths between A and B, LNA response curve 212 approximates an ideal linear response. For input signal strengths less than A, or greater than B, however, LNA response curve diverges from, respectively, linear projections 222a and 222b, resulting in non-linear performance instability of LNA 112 for those input strengths. As is well known in the art, when operating within its linear range, i.e. between A and B on graph 200, LNA 112 is capable of delivering an amplified signal substantially free of spurious noise. When forced to operate in the non-linear regions beyond points A and B, in FIG. 2A, however, due perhaps to reception of a large interference signal at antenna 102 in FIG. 1, LNA output signal 118 may include blocker signals, which can substantially interfere with reception quality.

Figure 2B:
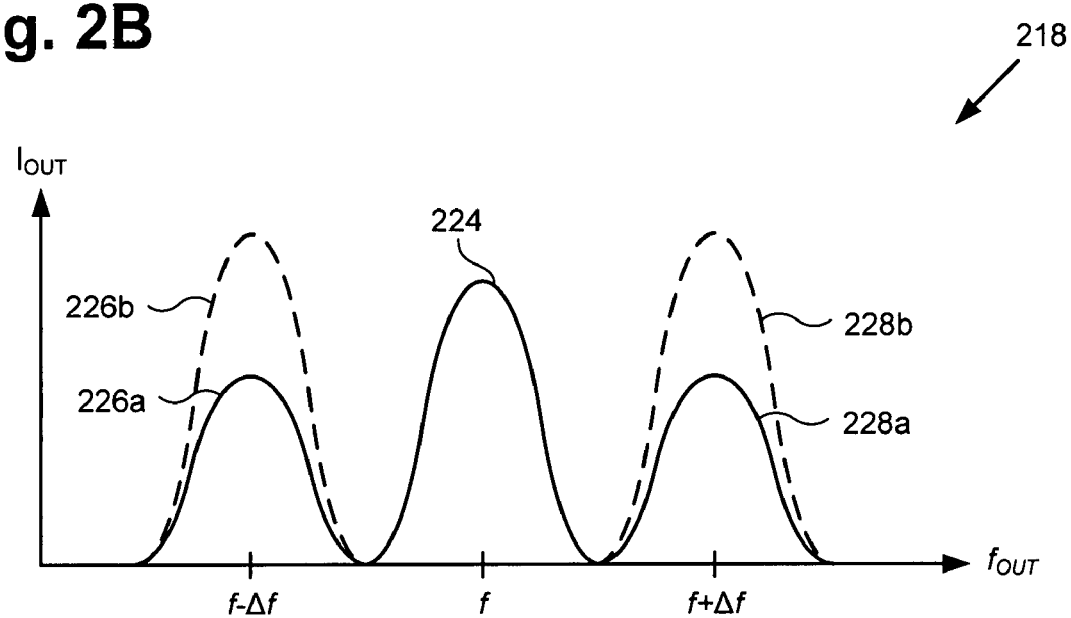
FIG. 2B is a graph showing the presence of blocker signals in addition to a desired reception signal.

FIG. 2B is a graph showing the presence of blocker signals in addition to a desired reception signal. Graph 218, in FIG. 2B, shows an exemplary frequency distribution of an LNA output signal, such as LNA output signal 118, in FIG. 1, produced during non-linear operation of LNA 112. The frequency spectrum of LNA output signal 118 ($f_{OUT}$) is shown on the x-axis of graph 218, while $I_{OUT}$, shown on the y-axis of graph 218, corresponds to the strength of the various frequency components of LNA output signal 118, in FIG. 1. Reception signal 224 corresponds to a desired reception signal having frequency f. Blocker signals 226a and 228a are shown separated from reception signal 224 by frequency shifts of plus or minus Δf. Where LNA 112 is utilized as part of a receiving system in an RF cellular telephone, for example, reception signal 224 may be at f=1.9 GHz, while blocker signals 226a and 228a may be separated from reception signal 224 by as little as a few hundred kHz, or as much as a few MHz.

FIG. 2B also shows blocker signals 226b and 228b, having the same respective frequencies as blocker signals 226a and 228a. Blocker signals 226b and 228b are provided in graph 218 to indicate that under certain LNA operating conditions, the strength of blocker frequency components included in LNA output signal 118, in FIG. 1, may exceed that of desired reception signal 224. As shown in FIG. 2B, the presence of blocker signals 226a and 228a, or 226b and 228b, present a significant source of interference with desired reception signal 224, arising from the non-linear operation of LNA 112. When combined with additional non-linearity effects resulting from signal mixing in mixer 114, the interferences introduced by conventional mixer circuit 110 can substantially degrade reception quality.

Figure 3:
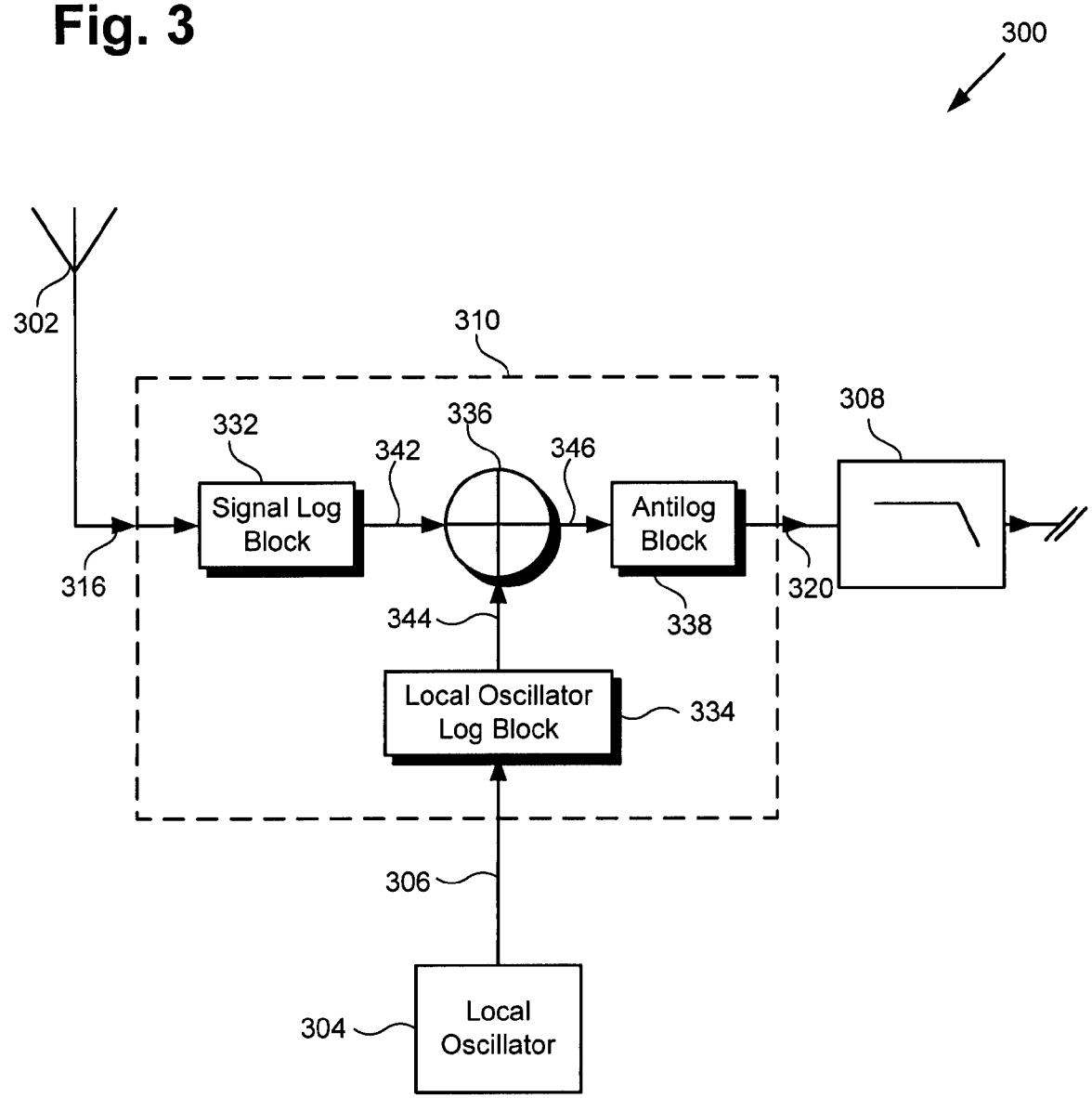
FIG. 3 is a block diagram showing a log-antilog mixer circuit for producing frequency conversion of a communication signal in a receiver, according to one embodiment of the present invention.

FIG. 3 is a block diagram showing a log-antilog mixer circuit for producing frequency conversion of a communication signal in a receiver, according to one embodiment of the present invention, capable of overcoming the drawbacks associated with the conventional implementation described previously in relation to FIG. 1. FIG. 3 shows receiving system 300 comprising antenna 302, local oscillator 304 providing local oscillator signal 306, and lowpass filter 308, corresponding respectively to receiving system 100 comprising antenna 102, local oscillator 104 providing local oscillator signal 106, and lowpass filter 108, in FIG. 1.

FIG. 3 also includes log-antilog mixer circuit 310, which replaces the conventional implementation of mixer circuit 110 shown in FIG. 1. Log-anti log mixer circuit 310 comprises signal log block 332, local oscillator log block 334, adder 336, and antilog block 338, which, collectively, replace LNA 112 and mixer 114 of mixer circuit 110, in FIG. 1. Also present in FIG. 3 are communication signal 316, coming from antenna 302, and log-antilog mixer circuit output signal 320, corresponding respectively to communication signal 116 and mixer circuit output signal 120, in FIG. 1. Moreover, FIG. 3 shows logarithmically transformed communication signal 342, logarithmic local oscillator signal 344, and sum signal 346, having no analogues in the conventional receiving system shown in FIG. 1. As was the case in FIG. 1, in FIG. 3, the broken lines at the output of lowpass filter 308 indicate the presence of other receiver components (not shown in FIG. 3), which may contribute to the processing of communication signal 316.

Receiving system 300 may be utilized in a receiver supporting cellular telephone communication, other types of mobile receivers operating at RF, or a stationary communication system, for example. As may be readily apparent to one of ordinary skill in the art, although the present example shown in FIG. 3 corresponds to implementation of log-antilog mixer circuit 310 in a receiver, in another embodiment, log-antilog mixer circuit 310 may readily be adapted for implementation in a transmitter. Similarly, in one embodiment, one or more versions of log-antilog mixer circuit 310 may be utilized in a transceiver, such as an RF transceiver used in a mobile communication device. For the purposes of the present discussion, let us assume that the exemplary implementation shown in FIG. 3 is utilized in an RF receiver receiving in a frequency range from approximately 1.8 GHz to approximately 2.1 GHz.

Figure 4:
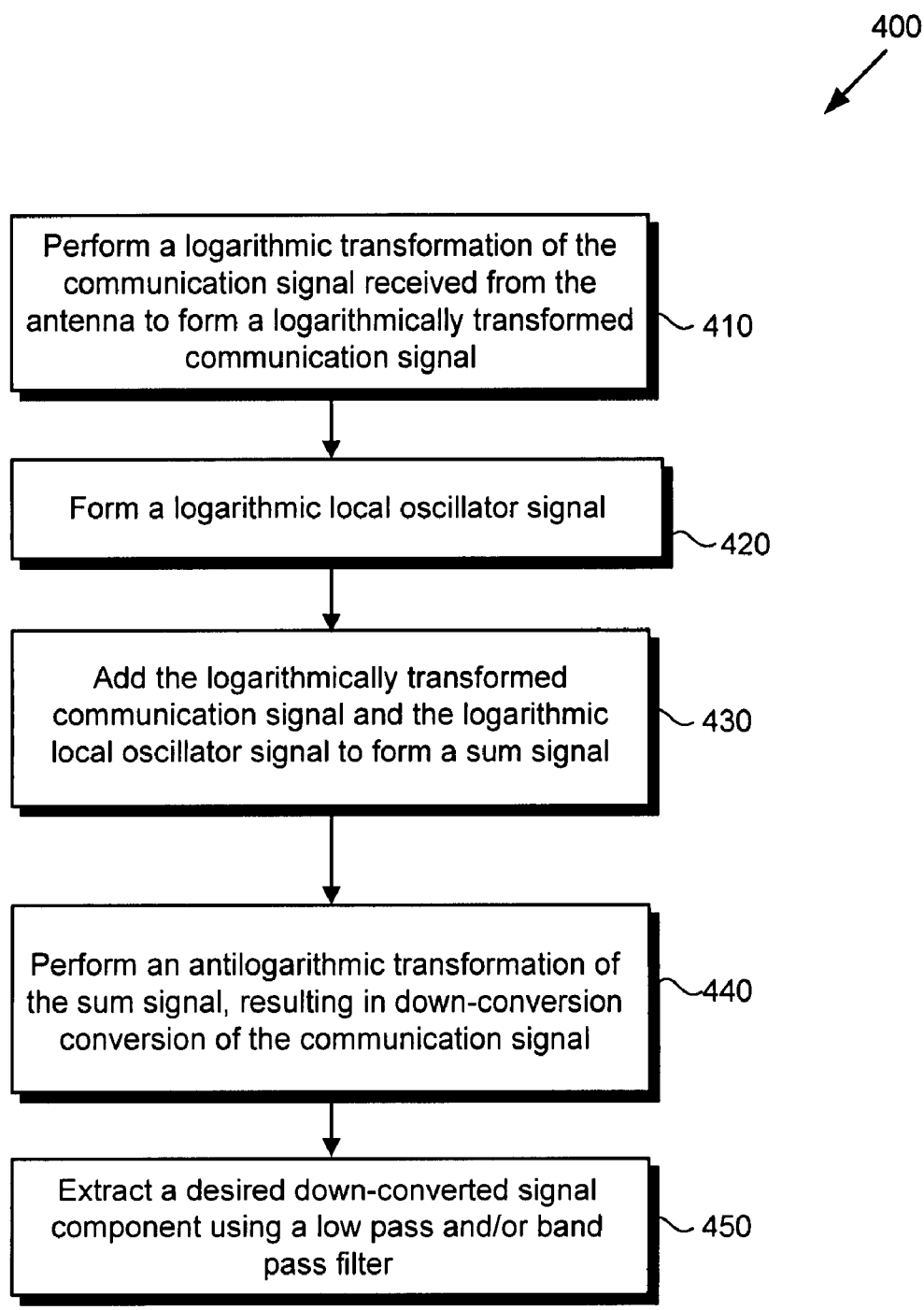
FIG. 4 is a flowchart of a method for producing frequency conversion of a communication signal, according to one embodiment of the present invention.

The operation of mixer circuit 310 in FIG. 3 is further explained in combination with FIG. 4, which shows flowchart 400 describing the steps, according to one embodiment of the present invention, for producing frequency conversion—in this instance down-conversion—of a communication signal. Certain details and features have been left out of flowchart 400 that are apparent to a person of ordinary skill in the art. For example, a step may comprise one or more substeps or may involve specialized equipment or materials, as known in the art. While steps 410 through 450 indicated in flowchart 400 are sufficient to describe one embodiment of the present invention, other embodiments of the invention may utilize steps different from those shown in flowchart 400.

Referring to step 410 of flowchart 400, in conjunction with FIG. 3, step 410 comprises performing a logarithmic transformation of communication signal 316 received from antenna 302 to form logarithmically transformed communication signal 342. It is noted that although the present embodiment shows communication signal 316 being fed into log-antilog mixer circuit 310 from antenna 302, in another exemplary implementation, communication signal 316 may be provided from a different source, such as a communication cable, for example.

Logarithmic transformation of communication signal 316 is performed in FIG. 3 by signal log block 332. Logarithmic transformation of communication signal 316, at step 410, permits omission from log-antilog mixer circuit 310, of LNA 112 and mixer 114, in FIG. 1. This is possible due to the mathematical properties of logarithmic functions, according to which addition of two logarithmic functions corresponds to a sum function containing the product of the arguments of the added functions as a sum function argument, according to the following logarithmic identity:

$$\log(A_1)+\log(A_2)=\text{Log}(A_1 \times A_2) \quad \text{(Equation 1)};$$

where $A_1$ is the argument of the first logarithmic function, $A_2$ is the argument of the second logarithmic function, and ($A_1 \times A_2$) is the argument of the sum function. Consequently, mixing of a signal logarithmically transformed at step 410 of flowchart 400, may be achieved through simple addition of that logarithmically transformed communication signal with a logarithmic local oscillator signal formed in step 420.

Formation of a logarithmic local oscillator signal in step 420 is achieved in log-antilog mixer circuit 310 of FIG. 3 by logarithmic transformation of local oscillator signal 306 by local oscillator log block 334. In another embodiment, log-antilog mixer circuit 310 may be provided with a logarithmic local oscillator signal by a logarithmic local oscillator signal generator (not shown in FIG. 3), in which case log-antilog mixer circuit 310 would not require local oscillator log block 334.

Continuing with step 430 of flowchart 400, step 430 comprises adding logarithmically transformed communication signal 342 and logarithmic local oscillator signal 344 to form sum signal 346. In FIG. 3, step 430 is implemented using adder 336. Although the embodiment of FIG. 3 includes adder 336, in one embodiment logarithmically transformed communication signal 342 and logarithmic local oscillator signal 344 take the form of current signals, so that adding those signals may be accomplished by merely passing them into a common circuit node coupling the output of signal log block 342 and local oscillator log block 334. In that embodiment, adder 336 can be omitted from log-antilog mixer circuit 310.

Proceeding with step 440 of flowchart 400, step 440 comprises performing an antilogarithmic transform of the sum signal formed in step 430. In FIG. 3, antilog transformation of sum signal 346 is performed by antilog block 338. As described previously, sum signal 346 corresponds to a logarithmic signal having, as its argument, the product of communication signal 316 and local oscillator signal 306. Antilogarithmic transformation of sum signal 346 results in the multiplied, or mixed, signal products of communication signal 316 and local oscillator signal 306 emerging as log-antilog mixer circuit output signal 320, which contains a desired down-converted signal component.

Referring to step 450 in flowchart 400, step 450 comprises extracting the desired down-converted signal component from mixer circuit output signal 320. In the embodiment of FIG. 3, down-converted signal extraction is performed by lowpass filter 308, corresponding to down-conversion of communication signal 316 from a reception frequency to baseband. In another embodiment, frequency conversion may comprise down-conversion from a reception frequency to an intermediate frequency, in which case extraction step 450 may be performed using a bandpass filter, rather than lowpass filter 308.

As may be apparent from the implicit functional symmetry of log-antilog mixer circuit 310, the advantages associated with the present embodiment may be implemented in a transmitting system as well. For example, substituting a transmitter local oscillator for local oscillator 304, a highpass filter for lowpass filter 308, and making other adaptations as known in the art, log-antilog mixer circuit 310 may be implemented to up-convert a communication signal. In one embodiment, a communication signal supplied by transmitter circuit components (not shown in FIG. 4) at baseband, could be up-converted to a transmission frequency by log-antilog mixer circuit 310 and provided to antenna 302 for transmission.

Figure 5A:
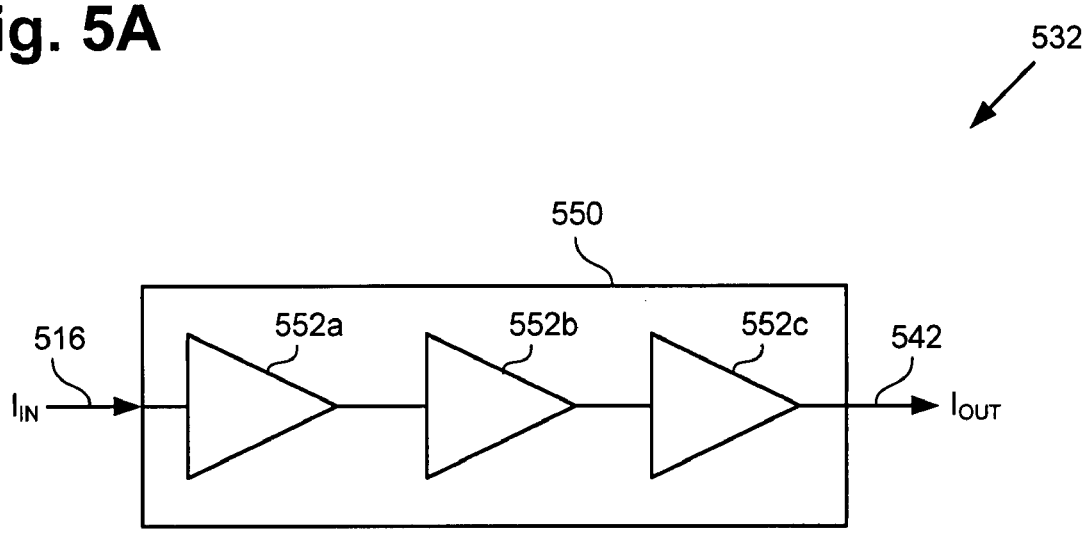
FIG. 5A shows an exemplary log transform circuit suitable for use in a log block in FIG. 3, according to one embodiment of the present invention.

FIG. 5A shows an exemplary log transform circuit suitable for use in the signal log block shown in FIG. 3, according to one embodiment of the present invention. In FIG. 5A, signal log block 532 receiving communication signal 516 as an input and providing logarithmically transformed communication signal 542 as an output, corresponds to signal log block 332 receiving communication signal 316 and providing logarithmically transformed communication signal 342, in FIG. 3. As shown in FIG. 5A, signal log block 532 comprises log transform circuit 550, which includes a multi-stage amplifier comprising substantially identical amplifiers 552a, 552b, and 552c in series. Although the present exemplary embodiment shows the multi-stage amplifier of log transform circuit 550 having three substantially identical stages, in other embodiments more stages may be present.

Figure 5B:
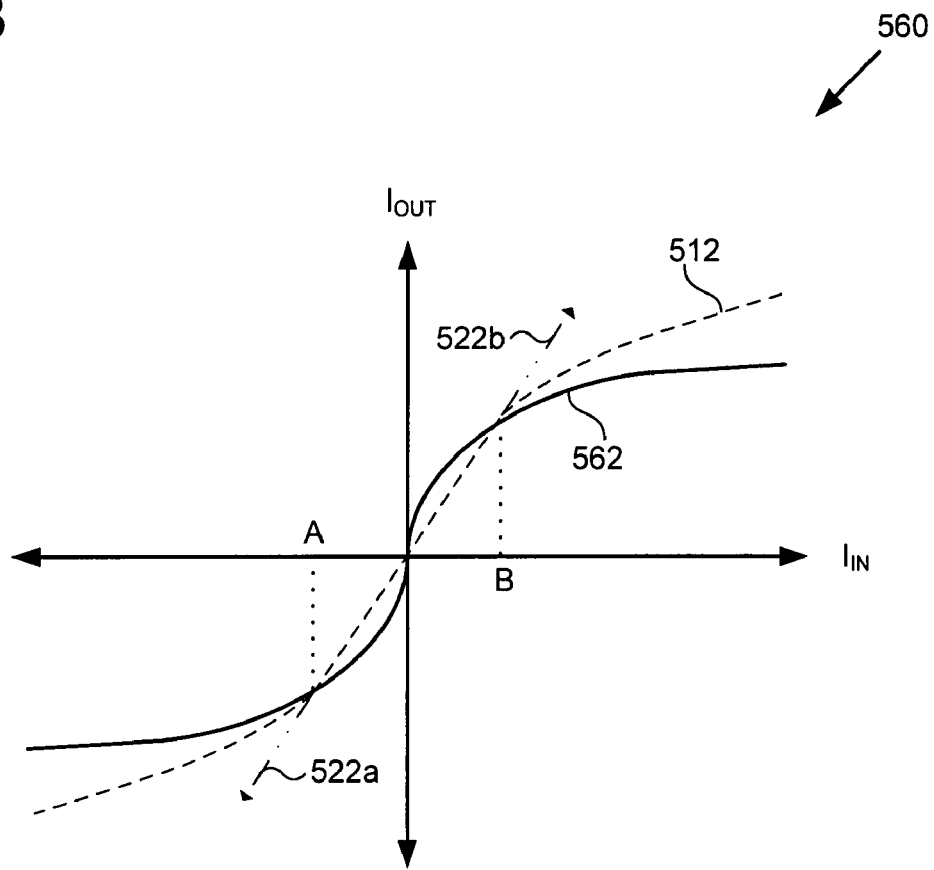
FIG. 5B is a graph comparing an exemplary performance profile for the log transform circuit of FIG. 5A with the LNA response curve shown in FIG. 2A.
Figure 5C:
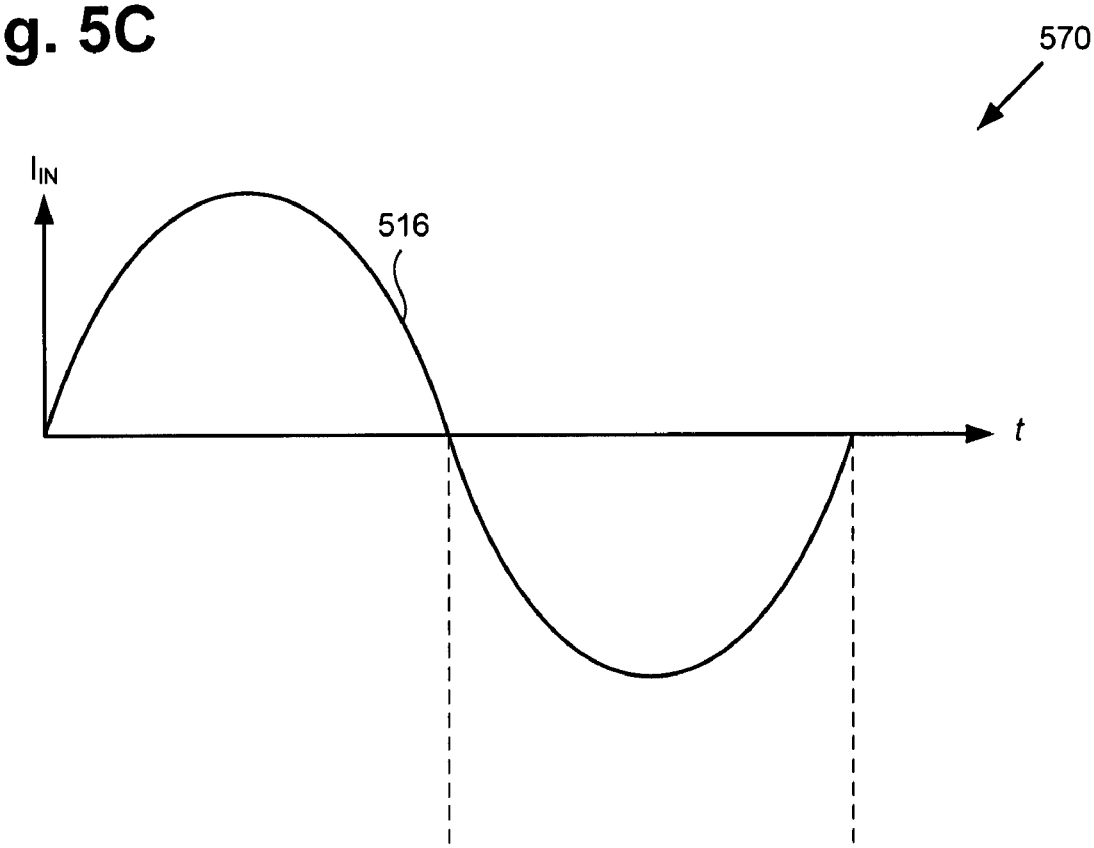
FIG. 5C is a graph showing an exemplary input signal to the log transform circuit of FIG. 5A.

In the embodiment of FIG. 5A, communication signal 516 is supplied as sinusoidal current input $I_{IN}$ (further shown in subsequent FIG. 5C). Successive amplifications of sinusoidal current input $I_{IN}$, performed by amplifiers 552a, 552b, and 552c, transform communication signal 516 into logarithmically transformed communication signal 542. Logarithmically transformed communication signal 542 is then provided as periodic logarithmic current output $I_{OUT}$ (further shown in subsequent FIG. 5D). An equivalent log transform circuit comprising a multi-stage amplifier may be utilized in local oscillator log block 334, in FIG. 3, to perform a logarithmic transformation of local oscillator signal 306, for example.

When implemented in both signal log block 332 and local oscillator log block 334, log transform circuit 550 may be utilized to provide logarithmically transformed communication signal 342 and logarithmic local oscillator signal 344 as current signals. One advantage of the described implementation is that by providing both logarithmic outputs as currents, the present embodiment enables addition of the logarithmic signals through direct combination at a common circuit node. As a result, implementation of log transform circuit 550 in log-antilog mixer circuit 310, in FIG. 3, may permit omission of adder 336.

FIG. 5B is a graph comparing an exemplary performance profile for the log transform circuit of FIG. 5A with the LNA response curve shown in FIG. 2A. Graph 560, in FIG. 5B, shows an exemplary output signal strength ($I_{OUT}$) as a function of the strength ($I_{IN}$) of a received communication signal. Received communication signal $I_{IN}$, shown on the x-axis of graph 560, corresponds to the strength of communication signal 116 and 516, in FIG. 1 and FIG. 5A, respectively, while $I_{OUT}$, shown on the y-axis of graph 560, corresponds to the strength of LNA output signal 118, in FIG. 1, and logarithmically transformed communication signal 542, in FIG. 5A. The performance of log transform circuit 550 over a range of input signal strengths is shown by log performance curve 562. Superposed on graph 560 is LNA response curve 512, shown as a dashed curve. FIG. 5B also shows the previously presented linear range of LNA response curve 512, by the dotted vertical lines intersecting the x-axis at points A and B, as well as linear projections 522a and 522b corresponding to the response of an ideal LNA.

Comparison of log performance curve 562 with LNA response curve 512 indicates some of the performance advantages of the embodiment shown in FIG. 5A. Whereas, as previously discussed, the performance of an LNA diverges from a linear ideal performance curve, resulting in performance instability and the appearance of blocker signals, log performance curve 562, in FIG. 5B reveals that log transform circuit 550 displays continuous performance across a wider range of signal input strengths. Let us recall that LNA performance curve 212 conforms to its theoretical performance only between points A and B, outside of which performance becomes unstable. Examination of log performance curve 562, by contrast, shows that the performance of log transform circuit 550 does not substantially deviate from theoretical values for input signal strengths corresponding to points beyond A and B. Instead, log performance curve 562 shows that those strong signals, which may be interference signals, are more effectively suppressed by the present embodiment, while weaker reception signals are more effectively amplified.

FIG. 5C is a graph showing an exemplary input signal to the log transform circuit of FIG. 5A. Comparison of FIG. 5C with FIG. 5D, which is a graph showing an exemplary logarithmic transformation of the input signal of FIG. 5C, reveals the result of passing a substantially sinusoidal input signal through a log transform circuit having a performance curve similar to that of log performance curve 562, in FIG. 5B. Graph 570, in FIG. 5C shows the strength of communication signal 516 as a function of time. As shown in FIG. 5C, communication signal 516 is a substantially sinusoidal function.

Figure 5D:
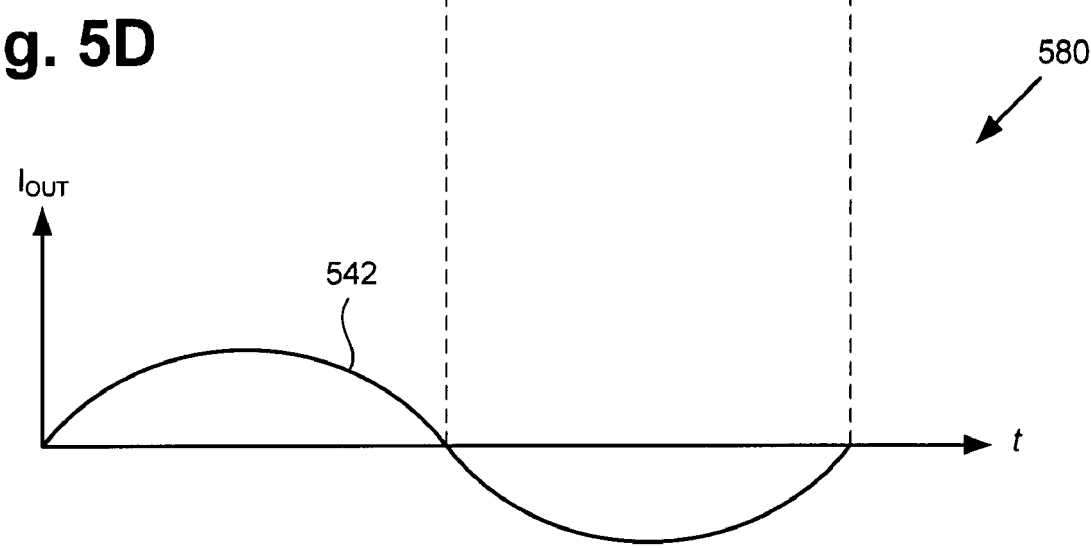
FIG. 5D is a graph showing an exemplary logarithmic transformation of the input signal of FIG. 5C.

Logarithmic transformation of communication signal 516, in FIG. 5C, by log transform circuit 550 having log performance curve 562, shown in FIGS. 5A and 5B, respectively, produces logarithmically transformed communication signal 542, expressed as a function of time in graph 580, of FIG. 5D. As shown by FIGS. 5C and 5D, logarithmic transformation of a sinusoidal input signal produces a periodic logarithmic function having substantially the same frequency as the sinusoidal input signal.

After addition of logarithmically transformed communication signal 542 with a logarithmic local oscillator signal, to form a sum signal, the sum signal undergoes an antilogarithmic transformation by an antilog block, corresponding to antilog block 338, in FIG. 3. Antilog block 338 performs an inverse transformation from that performed by log transform circuit 550, in FIG. 5A. Antilog block 338 may be analogously implemented using an antilog transform circuit comprising a multi-stage amplifier comprised of substantially identical amplifiers. An antilog multi-stage amplifier would, of course utilize amplifiers different from amplifiers 552a, 552b, and 552c, in FIG. 5A. The amplifiers utilized to perform an antilog transformation could be suitably selected to produce an inverse of the transformation from FIG. 5C to FIG. 5D, to result in transformation of logarithmic sum signal 346, in FIG. 3, into sinusoidal log-antilog mixer circuit output 320.

Figure 6:
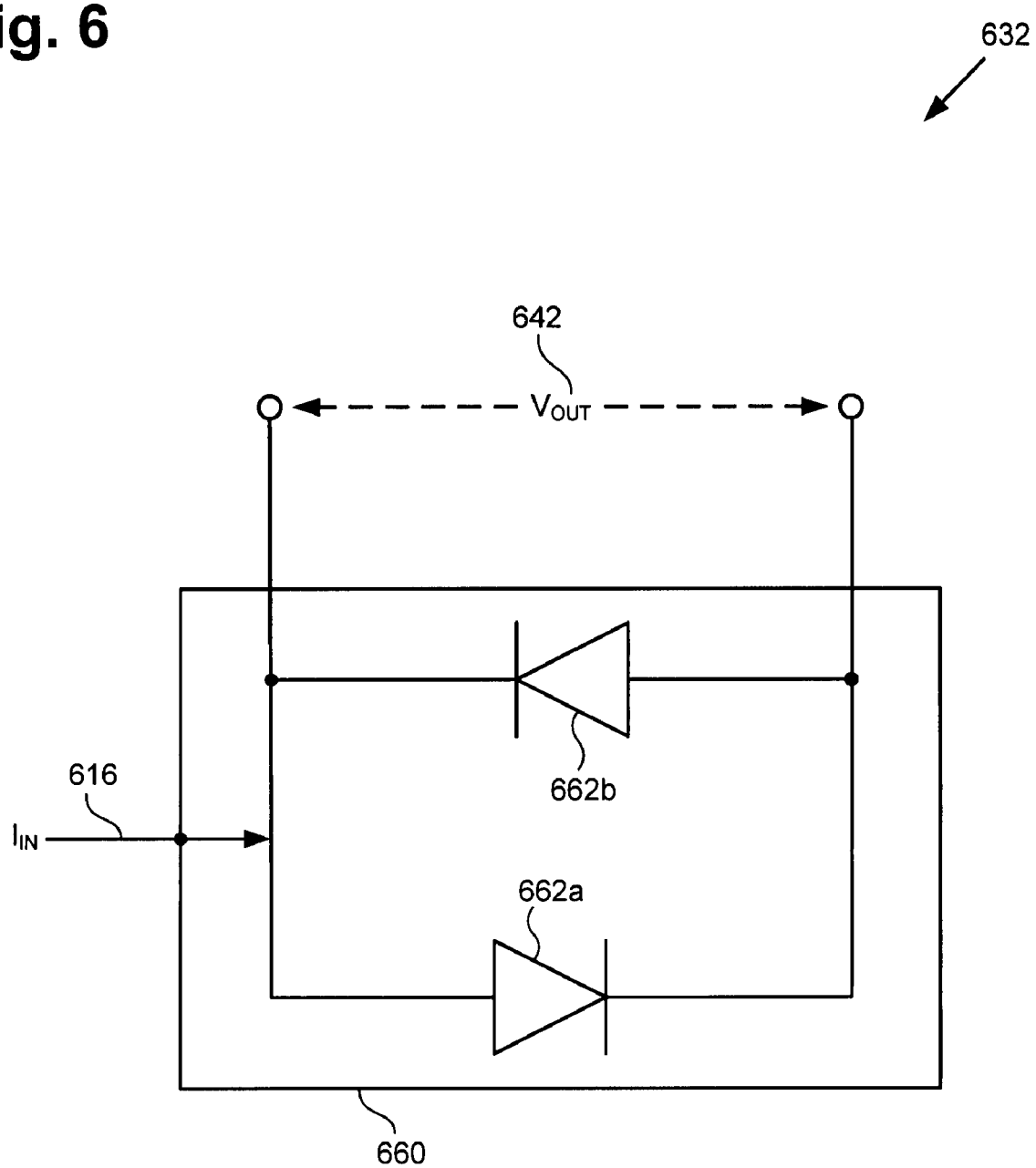
FIG. 6 shows an exemplary log transform circuit suitable for use in a log block in FIG. 3, according to another embodiment of the present invention.

FIG. 6 shows an exemplary log transform circuit suitable for use in the signal log block shown in FIG. 3, according to another embodiment of the present invention. In FIG. 6, signal log block 632 receiving communication signal 616 as an input and providing logarithmically transformed communication signal 642 as an output, corresponds to signal log block 332 receiving communication signal 316 and providing logarithmically transformed communication signal 342, in FIG. 3. As shown in FIG. 6, signal log block 632 comprises log transform circuit 660, which includes an anti-parallel pair of substantially identical diodes 662a and 662b. As in FIG. 5A, in the embodiment of FIG. 6, communication signal 616 is provided as a current input. Unlike the previous embodiment, however, log transform circuit 660 provides logarithmically transformed communication signal 642 as a voltage output.

Log transform circuit 660 can also be utilized in local oscillator log block 334, in FIG. 3, to provide logarithmic local oscillator signal 344 as a voltage. In that implementation, addition of logarithmically transformed communication signal 342 and logarithmic local oscillator signal 344, to form sum signal 346, would require additional circuitry, as known in the art, which is represented in FIG. 3 by adder 336. In a similar manner, an antilog transform circuit may be implemented, by reversal of the signal path shown in FIG. 6, for example, to transform a logarithmic voltage input into a sinusoidal current output corresponding to log-antilog mixer circuit output 320, in FIG. 3.

It is noted that FIGS. 5A and 6 show merely exemplary log transform circuits suitable for use in the signal log block shown in FIG. 3, and the choice of the exact log transform circuit does not vary the scope of the present of the invention. For example, the log transform function could be performed by using a pair of FETs (field effect transistors) operating in their subthreshold regions. This configuration has advantages, such as a lower complexity relative to the multi-stage amplifier configuration in FIG. 5A, and an improved gain relative to the anti-parallel diode configuration of FIG. 6.

In its various embodiments, the present invention's log-antilog mixer circuit and method for producing frequency conversion of a communication signal using same, can be utilized in a communication system in, for example, a wireless communications device, a cellular telephone, a Bluetooth enabled device, a computer, a satellite set-top box, an RF transceiver, a personal digital assistant (PDA), or in any other kind of system, device, component or module utilized as a receiver or transmitter in modern electronics applications.

By introducing a log-antilog mixer circuit and method for producing frequency conversion of a communication signal, the present disclosure describes a signal processing implementation which advantageously utilizes a mathematical property of logarithmic functions to support additive signal mixing. By replacing a conventional LNA and mixer circuit combination with a log-antilog mixer circuit, the described embodiments of the present invention provide increased blocker resistance. As a result, the various embodiments of the present invention make it possible to effectively frequency convert a desired communication signal, while suppressing undesirable interference signals. Consequently, the present disclosure enables use of a log-antilog mixer circuit and method for producing frequency conversion of a communication signal, capable of providing greater linearity across a wider dynamic range than is provided by conventional implementations.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a log-antilog mixer circuit and method for producing frequency conversion have been described.

The invention claimed is:

1. A method for producing a frequency conversion of a communication signal, said method comprising:
    performing a logarithmic transformation of said communication signal to form a logarithmically transformed communication signal;
    adding said logarithmically transformed communication signal to a logarithmic local oscillator signal to form a sum signal;
    performing an anti-logarithmic transformation of said sum signal to produce said frequency conversion of said communication signal.

2. The method of claim 1, wherein said frequency conversion produces a down-converted communication signal.

3. The method of claim 2, wherein said communication signal is down-converted from a reception frequency to baseband.

4. The method of claim 2, wherein said communication signal is received at a reception frequency in a range from approximately 1.8 GHz to approximately 2.1 GHz.

5. The method of claim 2, further comprising extracting a desired down-converted signal component from said down-converted communication signal using a lowpass and/or bandpass filter.

6. The method of claim 1, wherein said frequency conversion produces an up-converted communication signal.

7. The method of claim 6, wherein said communication signal is up-converted from baseband to a transmission frequency.

8. The method of claim 6, wherein said communication signal is transmitted at a transmission frequency in a range from approximately 1.8 GHz to approximately 2.1 GHz.

9. The method of claim 6, further comprising extracting a desired up-converted signal component from said up-converted communication signal using a highpass and/or bandpass filter.

10. The method of claim 1, wherein said logarithmic oscillator signal is produced by performing a logarithmic transformation of a local oscillator signal.

11. A log-antilog mixer circuit for producing a frequency conversion of a communication signal, said circuit comprising:
    a signal log block configured to receive said communication signal as an input and to provide a logarithmically transformed communication signal as an output;
    an antilog block coupled to said signal log block, said antilog block configured to receive a sum signal of said logarithmically transformed communication signal and a logarithmic local oscillator signal;
    said log block and said antilog block producing said frequency conversion of said communication signal.

12. The log-antilog mixer circuit of claim 11, further comprising an adder for adding said logarithmically transformed communication signal and said logarithmic local oscillator signal to produce said sum signal.

13. The log-antilog mixer circuit of claim 11, further comprising a local oscillator log block configured to receive a local oscillator signal as an input and to provide said logarithmic local oscillator signal as an output.

14. The log-antilog mixer circuit of claim 1, utilized in a receiver.

15. The log-antilog mixer circuit of claim 1, utilized in a transmitter.

16. The log-antilog mixer circuit of claim 11, wherein said signal log block comprises at least one multi-stage amplifier.

17. The log-antilog mixer circuit of claim 11, wherein said signal log block comprises at least one anti-parallel diode pair.

18. The log-antilog mixer circuit of claim 11, wherein said antilog block comprises at least one multi-stage amplifier.

19. The log-antilog mixer circuit of claim 1, wherein said antilog block comprises at least one anti-parallel diode pair.

20. The log-antilog mixer circuit of claim 1, utilized as a part of a communication system, said communication system being selected from the group consisting of a wireless communications device, a cellular telephone, a Bluetooth enabled device, a computer, a satellite set top box, and a personal digital assistant (PDA).

* * * * *